(12) United States Patent
Lopatin et al.

(10) Patent No.: US 6,686,263 B1
(45) Date of Patent: Feb. 3, 2004

(54) SELECTIVE FORMATION OF TOP MEMORY ELECTRODE BY ELECTROLESS FORMATION OF CONDUCTIVE MATERIALS

(75) Inventors: Sergey D. Lopatin, Santa Clara, CA (US); Minh Van Ngo, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/314,837

(22) Filed: Dec. 9, 2002

(51) Int. Cl.$^7$ ................................................ H01L 21/20
(52) U.S. Cl. ..................... 438/584; 438/624; 438/627; 438/597; 438/257; 438/652; 438/653
(58) Field of Search .................................. 438/624–627, 438/584, 597, 257, 652–653

(56) References Cited

U.S. PATENT DOCUMENTS

| | | | |
|---|---|---|---|
| 4,707,377 A | * | 11/1987 | Capwell et al. |
| 5,017,420 A | * | 5/1991 | Marikar et al. |
| 5,569,621 A | | 10/1996 | Yallup et al. |
| 5,656,553 A | | 8/1997 | Leas et al. |
| 5,825,076 A | | 10/1998 | Kotvas et al. |
| 6,051,866 A | | 4/2000 | Shaw et al. |
| 6,475,905 B1 | * | 11/2002 | Subramanian et al. ....... 438/637 |
| 2001/0013651 A1 | * | 8/2001 | Nakazawa ................... 257/737 |
| 2002/0001176 A1 | * | 1/2002 | Yoshida et al. |
| 2002/0077261 A1 | * | 6/2002 | Hwang et al. ............... 510/175 |
| 2002/0129953 A1 | * | 9/2002 | Miska .................... 174/35 GC |
| 2002/0182767 A1 | * | 12/2002 | Chen et al. |
| 2002/0817266 | * | 12/2002 | Izumi et al. |
| 2003/0138571 A1 | * | 7/2003 | Kunishi et al. ........... 427/443.1 |

FOREIGN PATENT DOCUMENTS

EP       000965656 A1 * 12/1999

* cited by examiner

*Primary Examiner*—Long Pham
(74) *Attorney, Agent, or Firm*—Amin & Turocy, LLP

(57) ABSTRACT

The present invention provides systems and methods that facilitate formation and use of organic memory devices. An electroless plating process is employed that operates at relatively low temperatures and without employing electrical current. The electroless process is utilized to form conductive layers, such as electrodes and the like, from conductive materials. The process includes depositing an activation compound on selected areas and then applying a chemical solution. The chemical solution contains metal ions. Then, a chemical reaction occurs reducing the metal ions and thereby plating the metal ions and forming a conductive layer. Specifically, the electroless process can be employed to form a top electrode of an organic memory device.

16 Claims, 9 Drawing Sheets

SELECTIVE FORMATION OF TOP MEMORY ELECTRODE BY ELECTROLESS FORMATION OF CONDUCTIVE MATERIALS

FIELD OF INVENTION

The present invention relates generally semiconductor fabrication and, in particular, to systems and methods of forming electroless conductive layers in semiconductor polymer memory devices.

BACKGROUND OF THE INVENTION

The volume, use and complexity of computers and electronic devices are continually increasing. Computers consistently become more powerful, new and improved electronic devices are continually developed (e.g., digital audio players, video players). Additionally, the growth and use of digital media (e.g., digital audio, video, images, and the like) have further pushed development of these devices. Such growth and development has vastly increased the amount of information desired/required to be stored and maintained for computer and electronic devices.

Generally, memory devices are employed in computer and electronic devices to store and maintain this information. Memory devices are typically formed on a semiconductor material such as silicon via a plurality of semiconductor fabrication processes such as layering, doping, heat treatments and patterning. Layering is an operation that adds thin layers to the wafer surface. Layers can be, for example, insulators, semiconductors and/or conductors and are grown or deposited via a variety of processes. Some common deposition techniques are chemical vapor deposition (CVD), evaporation and sputtering. Doping is the process that adds specific amounts of dopants to the wafer surface. The dopants can cause the properties of layers to be modified (e.g., change a semiconductor to a conductor). A number of techniques, such as thermal diffusion and ion implantation can be employed for doping. Heat treatments are another basic operation in which a wafer is heated and cooled to achieve specific results. Typically, in heat treatment operations, no additional material is added or removed from the wafer, although contaminates and vapors may evaporate from the wafer. One common heat treatment is annealing, which repairs damage to crystal structure of a wafer/device generally caused by doping operations. Other heat treatments, such as alloying and driving of solvents, are also employed in semiconductor fabrication.

Generally, a memory device includes arrays of memory cells, wherein each memory cell can be accessed or "read", "written", and "erased" with information. The memory cells maintain information in an "off" or an "on" state (e.g., are limited to 2 states), also referred to as "0" and "1". To store this information, a memory cell includes a capacitor structure having a top electrode, also referred to as a cell plate, a bottom electrode, also referred to as a storage node, and a charge holding material (e.g., oxide, oxide/nitride/oxide (ONO), . . . ) formed in between the top electrode and the bottom electrode. The top electrode and the bottom electrode are formed of a conductive material. This capacitor permits storage of a charge that allows the memory cell to store a single bit of information. Such memory cells typically employ a refresh signal to maintain the charge on the capacitor and thus, their information. Some examples of memory devices that employ such a capacitor are dynamic random access memory (DRAM), double data rate memory (DDR), flash memory, metal oxide semiconductor field effect transistor (MOSFET), and the like.

However, formation of the electrodes, particular the top electrode via conventional semiconductor fabrication processes is problematic. The conventional processes utilized to form the electrodes generally involve high temperatures and/or electroplating. These high temperatures, particularly for some chemistries, can damage previously formed components of the memory devices. Similarly, employing technologies such as electroplating also poses a significant risk of damaging previously formed components of the memory devices. Electroplating is a process for depositing metal by utilizing electrolysis with an aqueous metal salt solution. In a typical electroplating setup, two electrodes are immersed in a plating solution, such as a sample wafer and a counter electrode. Current is then supplied by an external power supply, and positively charged metal ions flow to the negatively charged cathode where they acquire electrons and deposit in the form of a metal film. Thus, when the wafer is charged negatively and the counter electrode positively, electroplating occurs. However, deposition occurs only on electrically contacted areas on a wafer. More importantly, the flow of electrons and ions can easily damage the already formed portions of the memory device. Thus, conventional technologies for forming electrodes can damage memory devices. The forming of the top electrode can be especially problematic because a substantial portion of the device has already been formed.

SUMMARY OF THE INVENTION

The following is a summary of the invention in order to provide a basic understanding of some aspects of the invention. This summary is not intended to identify key/critical elements of the invention or to delineate the scope of the invention. Its sole purpose is to present some concepts of the invention in a simplified form as a prelude to the more detailed description that is presented later.

The present invention relates generally semiconductor fabrication and, in particular, to systems and methods of forming electrodes at relatively low temperatures.

The present invention facilitates forming electrodes at low temperatures and mitigating memory element decomposition. An electroless plating process is employed that operates at relatively low temperatures, without employing electrical current. The electroless process is utilized to form conductive layers, such as electrodes and the like, from conductive materials. The process includes depositing an activation compound on selected areas and then applying a chemical solution, which contains a reducing agent and metal ions. Then, a chemical reaction occurs reducing the metal ions and thereby plating the metal ions and forming a conductive layer. The conductive layer formed by the present invention (e.g., electrode) can be utilized in organic memory devices.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
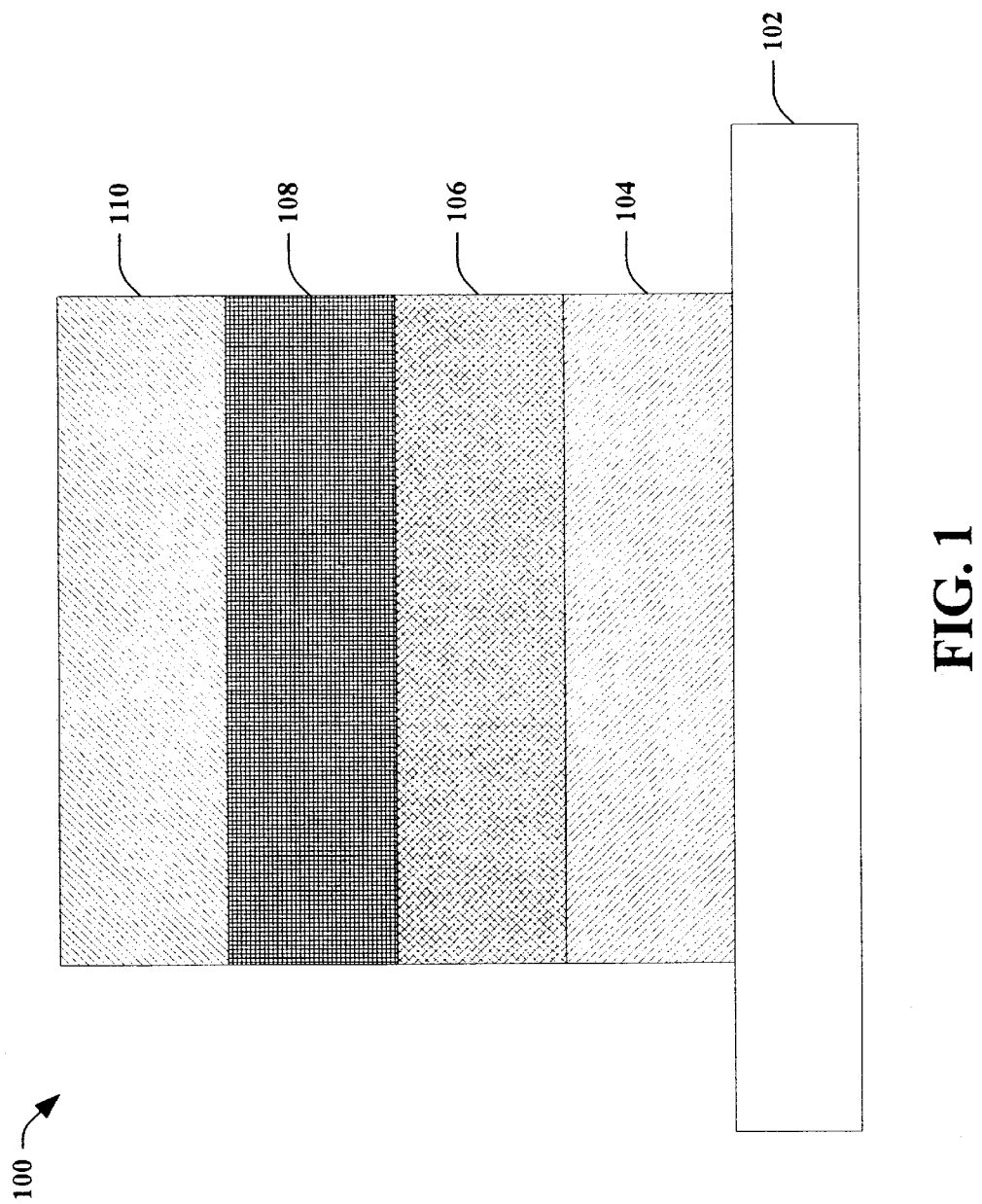
FIG. 1 is a block diagram illustrating an organic memory device in accordance with an aspect of the present invention.

The present invention is now described with reference to the drawings, wherein like reference numerals are used to refer to like elements throughout. In the following description, for purposes of explanation, numerous specific details are set forth in order to provide a thorough understanding of the present invention. It may be evident, however, that the present invention may be practiced without these specific details. In other instances, well-known structures and devices are shown in block diagram form in order to facilitate describing the present invention.

As used in this application, the term "computer component" is intended to refer to a computer-related entity, either hardware, a combination of hardware and software, software, or software in execution. For example, a computer component may be, but is not limited to being, a process running on a processor, a processor, an object, an executable, a thread of execution, a program, and/or a computer. By way of illustration, both an application running on a server and the server can be a computer component. One or more computer components may reside within a process and/or thread of execution and a component may be localized on one computer and/or distributed between two or more computers.

The present invention facilitates fabrication of electrodes by employing an electroless plating metal deposition process. This process occurs by chemical reaction from an aqueous metal salt solution also containing a reducing agent. This metal deposition is operative to be performed at about 35–75° C. Unlike electroplating processes, no external power supply is required. A wafer containing fabricated memory devices is placed in contact with the solution. Metal ions and a reducing agent react on a catalytic surface (e.g., activation compound) that has previously been deposited. Thus, electrodes can be formed in selected and electrically isolated areas at the same time, which is not generally possible with other techniques such as electroplating. Further, electrodes can be formed within trenches or vias by utilizing the electroless metal deposition process.

Referring to FIG. 1, a block diagram of an organic memory device 100 in accordance with an aspect of the present invention is depicted. The memory device 100 includes a bottom electrode 104, a passive layer 106, a polymer layer 108, and a top electrode 110. The organic memory device 100 is capable of maintaining two or more states unlike conventional inorganic memory devices which maintain only two states. Thus, a single cell of the organic memory device 100 can hold one or more bits of information. Furthermore, the organic memory device 100 is a non-volatile memory device and consequently, does not require a constant or nearly constant power supply.

The bottom electrode 104 is formed by depositing a first conductive material over a substrate 102. Trenches and/or vias can be formed in the substrate (although not shown) prior to deposition of the conductive material followed by selectively depositing the first conductive material into the trenches. The first conductive material is comprised of a conductive material such as, copper, aluminum, chromium, germanium, gold, magnesium, manganese, indium, iron, nickel, palladium, platinum, silver, titanium, zinc, alloys thereof, indium-tin oxide, polysilicon, doped amorphous silicon, metal silicides, and the like. Exemplary alloys that can be utilized for the conductive material include copper alloys, Hastelloy®, Kovar®, Invar, Monel®, Inconel®, brass, stainless steel, magnesium-silver alloy, and various other alloys.

The passive layer 106 is formed on the bottom electrode 104. The passive layer 106 contains at least one conductivity facilitating compound that has the ability to donate and accept charges (holes and/or electrons). Generally, the conductivity facilitating compound has at least two relatively stable oxidation-reduction states which permit the conductivity facilitating compound to donate and accept charges. Examples of conductivity facilitating compounds that can be employed for the passive layer 106 include one or more of the following: copper sulfide ($Cu_2S$, CuS), copper oxide (CuO, $Cu_2O$), manganese oxide ($MnO_2$), titanium dioxide ($TiO_2$), indium oxide ($I_{3O4}$), silver sulfide ($Ag_2S$, AgS), iron oxide ($Fe_3O_4$), and the like. The passive layer 106 may be grown using oxidation techniques, formed via gas phase reactions, or deposited between the electrodes.

The passive layer 106 is operative to transport charge from the first electrode 104 to the interface between the organic layer 108 and the passive layer 106. Additionally, the passive layer 106 facilitates charge carrier (e.g., electrons or holes) injection into the organic layer 108 and increases the concentration of the charge carrier in the organic layer resulting in a modification of the conductivity of the organic layer 108. Furthermore, the passive layer 106 can also store opposite charges in the passive layer 106 in order to balance the total charge of the device 100.

The passive layer 106 can in some instances act as a catalyst when forming the organic layer 108. In this connection, the backbone of the conjugated organic molecule may initially form adjacent the passive layer 106, and grow or assemble away and substantially perpendicular to the passive layer surface. As a result, the backbones of the conjugated organic molecule may be self aligned in a direction that traverses the two electrodes.

The organic layer 108 is formed on the passive layer 106 and results in an interface between the two layers. The organic layer 108 can be formed via a number of suitable techniques. One such technique involves growing the organic layer 108 from the passive layer 106. Another technique that can be utilized is a spin-on technique which involves depositing a mixture of the material and a solvent, and then removing the solvent from the substrate/electrode. Another suitable technique is chemical vapor deposition (CVD). CVD includes low pressure chemical vapor deposition (LPCVD), plasma enhanced chemical vapor deposition (PECVD), and high density chemical vapor deposition (HDCVD). It is not typically necessary to functionalize one or more ends of the organic molecule in order to attach it to an electrode/passive layer. Sometime it may have a chemical bond formed between the conjugated organic polymer and the passive layer 106.

The organic layer 108 is typically comprised of a conjugated organic material, such as a small organic molecule and a conjugated polymer. If the organic layer is polymer, a polymer backbone of the conjugated organic polymer may extend lengthwise between the electrodes 104 and 110 (e.g., generally substantially perpendicular to the inner, facing surfaces of the electrodes 104 and 110). The conjugated organic molecule can be linear or branched such that the backbone retains its conjugated nature. Such conjugated molecules are characterized in that they have overlapping $\pi$ orbitals and that they can assume two or more resonant structures. The conjugated nature of the conjugated organic materials contributes to the controllably conductive properties of the selectively conductive media.

In this connection, the conjugated organic material has the ability to donate and accept charges (holes and/or electrons). Generally, the conjugated organic molecule has at least two relatively stable oxidation-reduction states. The two relatively stable states permit the conjugated organic polymer to donate and accept charges and electrically interact with the conductivity facilitating compound.

The organic material may be cyclic or acyclic. For some cases, such as organic polymers, the organic material self assembles between the electrodes during formation or deposition. Examples of conjugated organic polymers include one or more of polyacetylene (cis or trans); polyphenylacetylene (cis or trans); polydiphenylacetylene; polyaniline; poly(p-phenylene vinylene); polythiophene; polyporphyrins; porphyrinic macrocycles, thiol derivatized polyporphyrins; polymetallocenes such as polyferrocenes, polyphthalocyanines; polyvinylenes; polystiroles; and the like. Additionally, the properties of the organic material can be modified by doping with a suitable dopant (e.g., salt). The passive layer 106 and the organic layer 108 are collectively referred to as a selectively conductive media. Collectively these layers, selectively facilitates migration of charge (e.g., at least one of electrons and holes) between the electrodes of the memory cell.

The top electrode 110 is formed on/over the organic layer 108 and/or the passive layer 106. The top electrode 110 is comprised of a conductive material such as nickel, cobalt, chromium, silver, copper, other suitable materials, and/or alloys thereof. Additionally, alloys with copper and alloys with phosphor and boron can also be employed, for example, copper-cobalt-tungsten-phosphorus alloy The top electrode 110 is formed by utilizing an electroless plating process, which includes an electroless reaction with two partial reactions, oxidation and reduction. The process is initiated by first selectively depositing an activation compound or seed layer over the organic layer 108. A suitable activation compound, such as SnPd, is utilized which acts as a catalyst for the desired reaction. Then, a chemical solution comprising a reducing agent and metal ions is applied to the wafer 106 by a suitable mechanism. One such mechanism is to immerse the wafer 106 in a bath of the chemical solution. The metal ions can be nickel, cobalt, chromium, silver, copper, and the like in order to form the top electrode 110. The reduction causes the metal ions to form on the surface of the wafer 106 at the locations where the activation compound has been deposited. Additionally, this electroless reaction occurs at relatively low temperatures of about 35–75° C.

The thickness of the bottom electrode 104 and the top electrode 110 can vary depending on the implementation and the memory device being constructed. However, some exemplary thickness ranges include about 0.01 $\mu$m or more and about 10 $\mu$m or less, about 0.05 $\mu$m or more and about 5 $\mu$m or less, and/or about 0.1 $\mu$m or more and about 1 $\mu$m or less.

The organic layer 108 and the passive layer 106 are collectively referred to as a selectively conductive media or a selectively conductive layer. The conductive properties of this media (e.g., conductive, non-conductive, semi-conductive) can be modified in a controlled manner by applying various voltages across the media via the electrodes 104 and 110.

The organic layer 108 has a suitable thickness that depends upon the chosen implementations and/or the memory device being fabricated. Some suitable exemplary ranges of thickness for the organic polymer layer 108 are about 0.001 $\mu$m or more and about 5 $\mu$m or less, about 0.01 $\mu$m or more and about 2.5 $\mu$m or less, and about a thickness of about 0.05 $\mu$m or more and about 1 $\mu$m or less. Similarly, the passive layer 106 has a suitable thickness that can vary based on the implementation and/or memory device being fabricated. Some examples of suitable thicknesses for the passive layer 106 are as follows: a thickness of about 2 Å or more and about 0.1 $\mu$m or less, a thickness of about 10 Å or more and about 0.01 $\mu$m or less, and a thickness of about 50 Å or more and about 0.005 $\mu$m or less.

In order to facilitate operation of the organic memory device 100, the organic layer 108 is generally thicker than the passive layer 106. In one aspect, the thickness of the organic layer is from about 0.1 to about 500 times greater than the thickness of the passive layer. It is appreciated that other suitable ratios can be employed in accordance with the present invention.

The organic memory device 100, like conventional memory devices, can have two states, a conductive (low impedance or "on") state or non-conductive (high impedance or "off") state. However, unlike conventional memory devices, the organic memory device is able to have/maintain a plurality of states, in contrast to a conventional memory device that is limited to two states (e.g., off or on). The organic memory device can employ varying degrees of conductivity to identify additional states. For example, the organic memory device can have a low impedance state, such as a very highly conductive state (very low impedance state), a highly conductive state (low impedance state), a conductive state (medium level impedance state), and a non-conductive state (high impedance state) thereby enabling the storage of multiple bits of information in a single organic memory cell, such as 2 or more bits of information or 4 or more bits of information (e.g., 4 states providing 2 bits of information, 8 states providing 3 bits of information . . . ).

During typical device operation, electrons flow from the second electrode 110 through the selectively conductive media to the first electrode 104 based on a voltage applied to the electrodes by the voltage source 102 if the organic layer is n-type conductor. Alternately, holes flow from the first electrode 104 to second electrode 110 if the organic layer 108 is p-type conductor, or both electrons and holes flow in the organic layer if it can be both n and p type with proper energy band match with 106 and 110. As such, current flows from the first electrode 104 to the second electrode 110 via the selectively conductive media.

Switching the organic memory device to a particular state is referred to as programming or writing. Programming is accomplished by applying a particular voltage (e.g., 0.9 volts, 0.2 volts, 1 volts, . . . ) across the selectively conductive media via the electrodes 104 and 110. The particular voltage, also referred to as a threshold voltage, varies according to a respective desired state and is generally substantially greater than voltages employed during normal operation. Thus, there is typically a separate threshold voltage that corresponds to respective desired states (e.g., "off", "on". . . ). The threshold value varies depending upon a number of factors including the identity of the materials that constitute the organic memory device, the thickness of the various layers, and the like. The voltage supply 102 is controllably employed to apply the threshold voltage in this aspect of the invention. However, other aspects of the invention can utilize other means to apply threshold voltages.

Generally speaking, the presence of an external stimuli such as an applied electric field that exceeds a threshold value ("on" state) permits an applied voltage to write, read, or erase information into/from the organic memory cell; whereas the absence of the external stimuli that exceeds a threshold value ("off" state) prevents an applied voltage to write or erase information into/from the organic memory cell.

To read information from the organic memory device, a voltage or electric field (e.g., 2 volts, 1 volts, 5 volts) is applied via the voltage source 102. Then, an impedance measurement is performed which, therein determines which operating state the memory device is in (e.g., high impedance, very low impedance, low impedance, medium impedance, and the like). As stated supra, the impedance relates to, for example, "on" (e.g., 1) or "off" (e.g., 0) for a dual state device or to "00", "01", "10", or "11" for a quad state device. It is appreciated that other numbers of states can provide other binary interpretations. To erase information written into the organic memory device, a negative voltage or a polarity opposite the polarity of the writing signal that exceeds a threshold value is applied.

Figure 2:
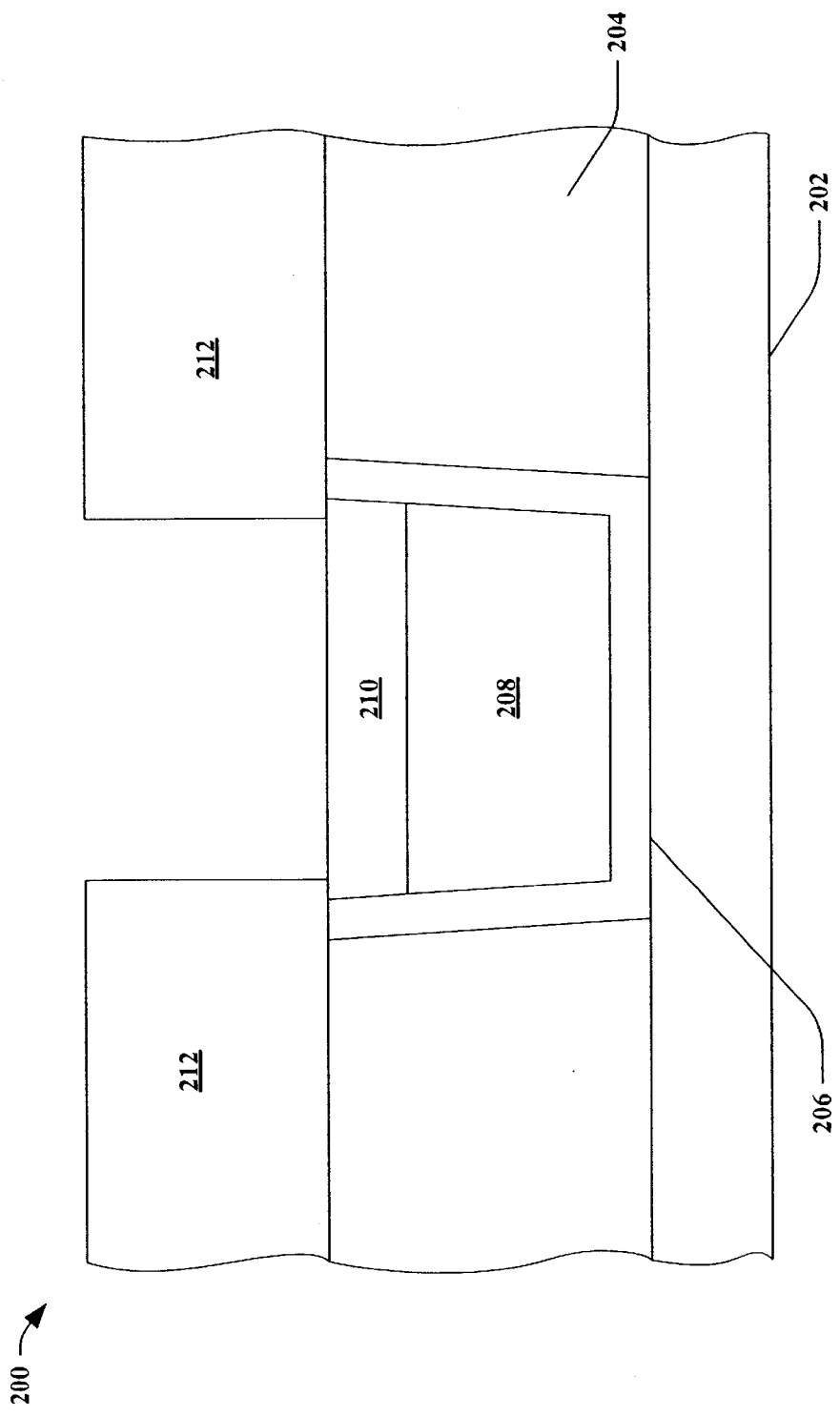
FIG. 2 is a cross sectional view of an organic memory device in accordance with an aspect of the present invention.

FIG. 2 illustrates a cross sectional view 200 of a memory device in accordance with an aspect of the present invention. The memory device is depicted at a first stage of processing referred to as a pre-electrode formation stage. For illustrative purposes, only a single memory cell is illustrated. However, it is appreciated that the memory device can any suitable number of memory cells that can be arranged into memory arrays.

At this stage of processing, the memory device includes a dielectric layer 204, a barrier layer 206, a bottom electrode 208, a passive layer 210 and an inner layer dielectric 212. The dielectric layer 204 is formed on a semiconductor substrate 202 and can be comprised of a semiconductor material such as, for example, substantially any type of material having dielectric properties. The substrate 202 includes one or more semiconductor layers. A trench is formed in the dielectric layer 204 to permit formation of the bottom electrode. Typically, some type of patterning/etching process is employed to form the trench. The barrier layer 206 is formed within the trench, including the bottom and sidewalls to mitigate diffusion of the bottom electrode 208 into the dielectric layer 204 and/or the substrate 202. The bottom electrode 208 is then formed in the trench over the barrier layer 206. The bottom electrode 208 is comprised of a conductive material such as, copper, aluminum, chromium, germanium, gold, magnesium, manganese, indium, iron, nickel, palladium, platinum, silver, titanium, zinc, alloys thereof, indium-tin oxide, polysilicon, doped amorphous silicon, metal silicides, and the like. Exemplary alloys that can be utilized for the conductive material include copper alloys, Hastelloy®, Kovar®, Invar, Monel®, Inconel®, brass, stainless steel, magnesium-silver alloy, and various other alloys.

The passive layer 210 is formed in/over the bottom electrode. The passive layer 210 contains at least one conductivity facilitating compound that has the ability to donate and accept charges (holes and/or electrons). Examples of conductivity facilitating compounds that can be employed for the passive layer 106 include one or more of the following: copper sulfide ($Cu_2S$, $CuS$), copper oxide ($CuO$, $Cu_2O$), manganese oxide ($MnO_2$), titanium dioxide ($TiO_2$), indium oxide ($I_3O_4$), silver sulfide ($Ag_2S$, $AgS$), iron oxide ($Fe_3O_4$), and the like. Generally, the conductivity facilitating compound has at least two relatively stable oxidation-reduction states which permit the conductivity facilitating compound to donate and accept charges. The passive layer 210 can be grown using oxidation techniques, formed via gas phase reactions, deposited between the electrodes and/or using other suitable techniques.

The passive layer 210 is operative to facilitate transport of charge from the first electrode 104. Additionally, the passive layer 210 facilitates charge carrier (e.g., electrons or holes) injection into an organic layer and increases the concentration of the charge carrier in the organic layer resulting in a modification of the conductivity of the organic layer. Furthermore, the passive layer 210 can also store opposite charges in the passive layer 210 in order to balance the total charge of the memory device.

The inner layer dielectric (ILD) 212 is selectively formed (e.g., deposited and patterned) over at least a portion of the dielectric layer 204 and at least a portion of the passive layer 210. The ILD is patterned so as to allow proper formation of the electrode/capacitor stack. The ILD 212 can be comprised of dielectric materials similar to those employed for the dielectric layer 204. It is appreciated that a combination of the ILD 212 and the dielectric layer 204 can also be referred to as an inner layer dielectric.

Figure 3:
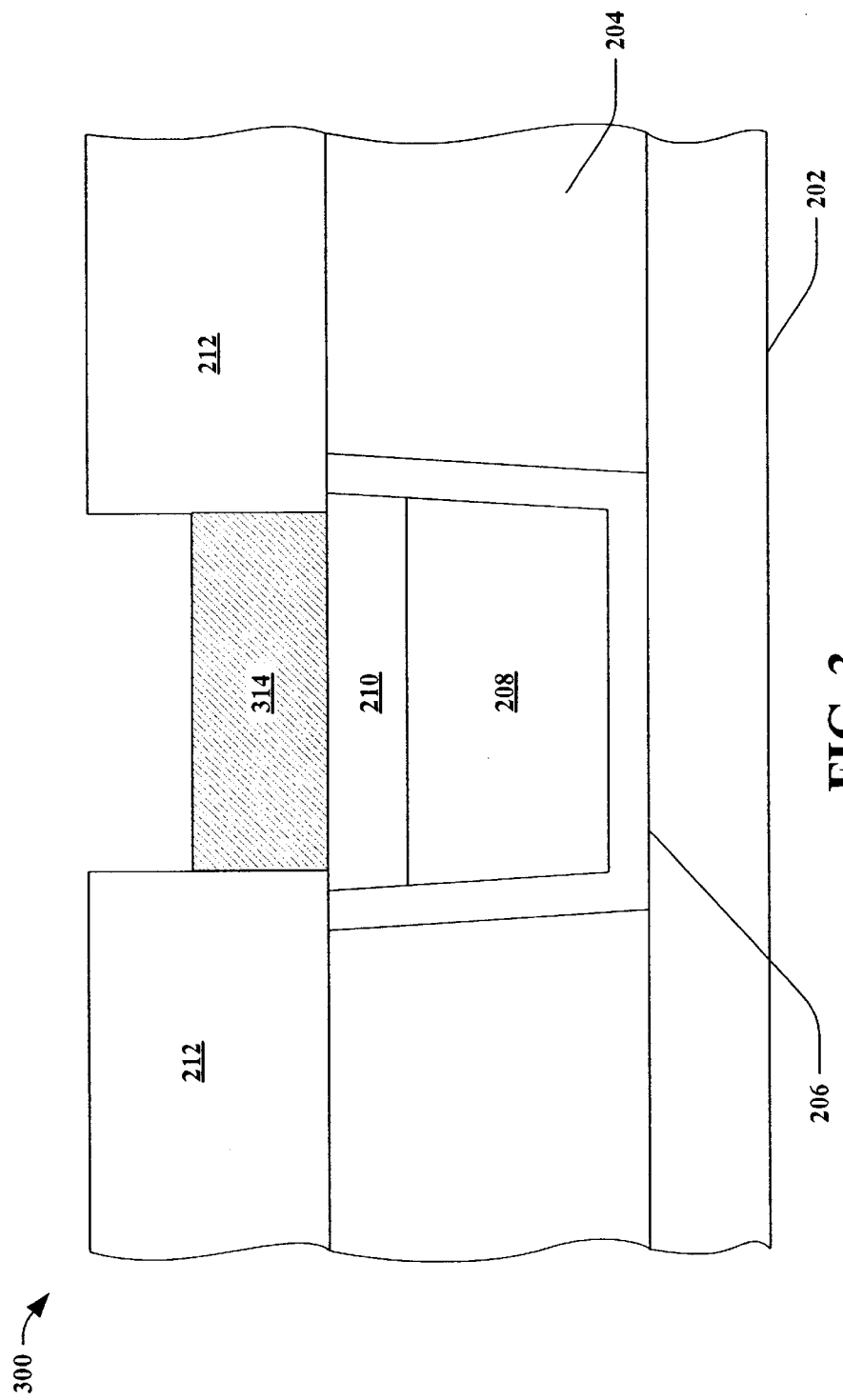
FIG. 3 is a cross sectional view of an organic memory device in accordance with an aspect of the present invention.

FIG. 3 illustrates another cross sectional view 300 of the memory device in accordance with an aspect of the present invention. The memory device of FIG. 2 is depicted at a next stage of fabrication. At this stage, an organic layer 314 is formed on the passive layer 210. This organic layer 314 can also be referred to as a memory polymer.

The formation of the organic layer 314 on the passive layer 210 results in an interface between the two layers. The organic layer 314 can be formed via a number of suitable techniques described supra. The organic layer 314 is comprised of a conjugated organic material, such as a small organic molecule and a conjugated polymer. The conjugated nature of the conjugated organic materials contributes to the controllably conductive properties of the selectively conductive media.

The conjugated organic material has the ability to donate and accept charges (holes and/or electrons). Generally, the conjugated organic molecule has at least two relatively stable oxidation-reduction states. The two relatively stable states permit the conjugated organic polymer to donate and accept charges and electrically interact with the conductivity facilitating compound of the passive layer 210. Examples of conjugated organic polymers that can be employed for the organic layer 314 include one or more of polyacetylene (cis or trans); polyphenylacetylene (cis or trans); polydiphenylacetylene; polyaniline; poly(p-phenylene vinylene); polythiophene; polyporphyrins; porphyrinic macrocycles, thiol derivatized polyporphyrins; polymetallocenes such as polyferrocenes, polyphthalocyanines; polyvinylenes; polystiroles; and the like. Additionally, the properties of the organic material can be modified by doping with a suitable dopant (e.g., salt).

Figure 4:
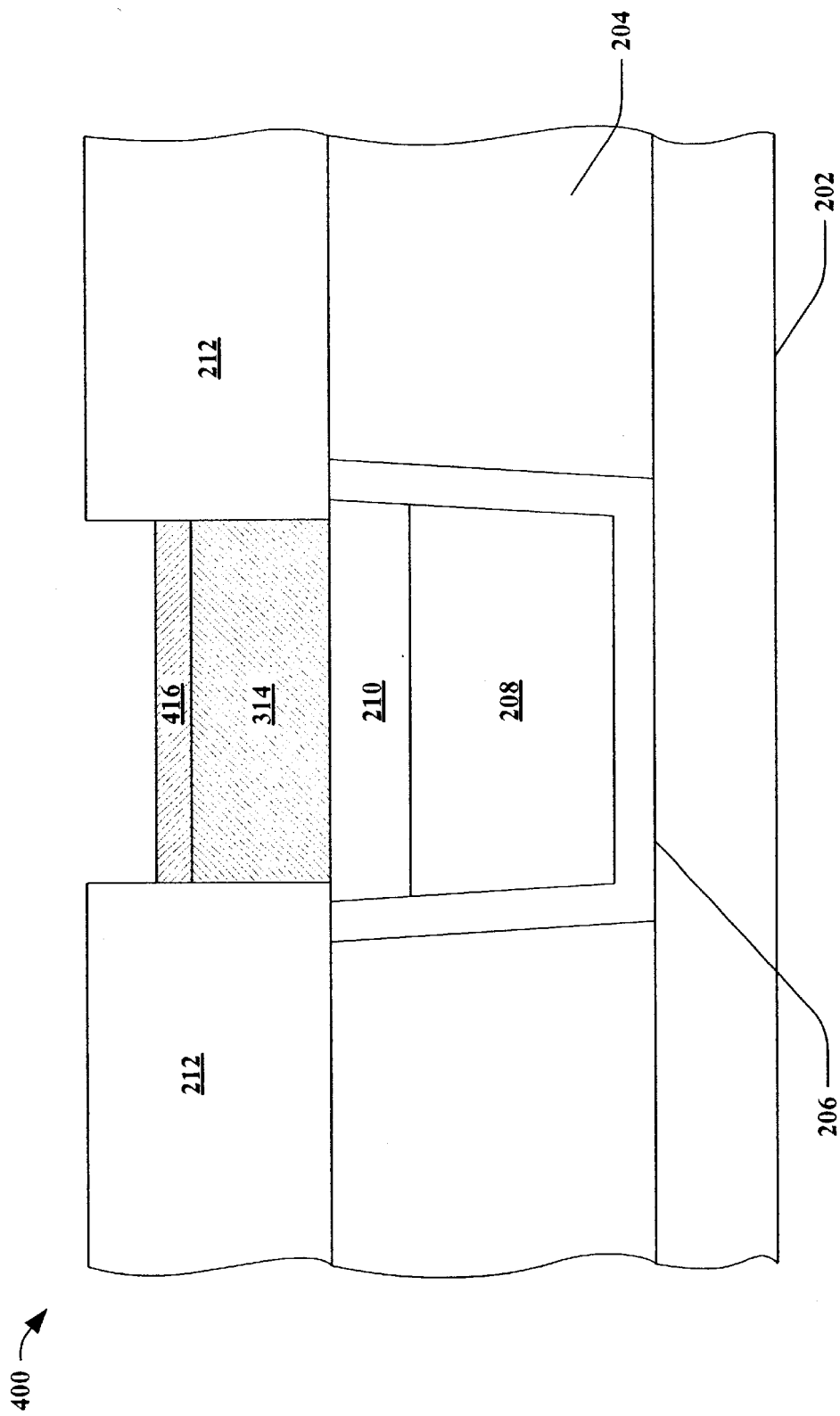
FIG. 4 is a cross sectional view of an organic memory device in accordance with an aspect of the present invention.

Turning now to FIG. 4, yet another cross sectional view 400 of the memory device in accordance with an aspect of the present invention is depicted. An activation compound 416 is selectively deposited on the polymer layer 314. The activation compound 416 acts as a catalyst for a desired electroless reaction which eventually forms the electrode. A suitable compound that can be employed for the activation compound is SnPd. However, it is appreciated that other suitable compounds can be employed as the activation compound 416 and to act as the catalyst in the electroless reaction, for example, silver, copper, palladium, tin.

Figure 5:
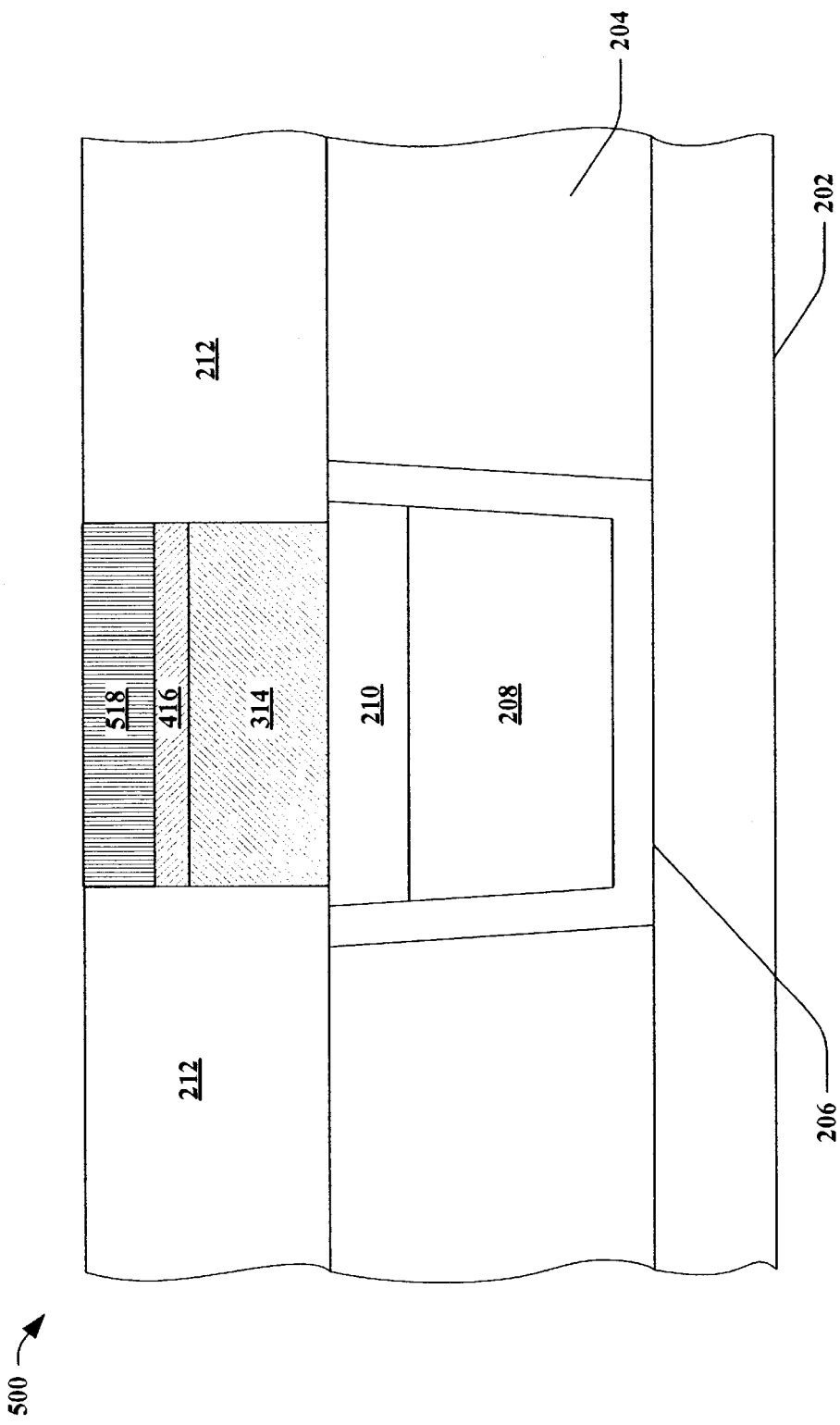
FIG. 5 is a cross sectional view of an organic memory device in accordance with an aspect of the present invention.

Referring to FIG. 5, another cross section view 500 of the memory device in accordance with an aspect of the present invention is illustrated. The memory device is shown at another stage of fabrication. A chemical solution is applied and thereby initiates a selective electroless plating process. This process forms selective layer 518. The chemical solution includes one or more ions selected from the group comprising nickel, cobalt, chromium, silver, copper and the like. The electroless deposition comprises two partial reactions, oxidation and reduction of the ions on the activation compound 416 that result in plating the metal ions at locations of the previously deposited activation compound.

Figure 6:
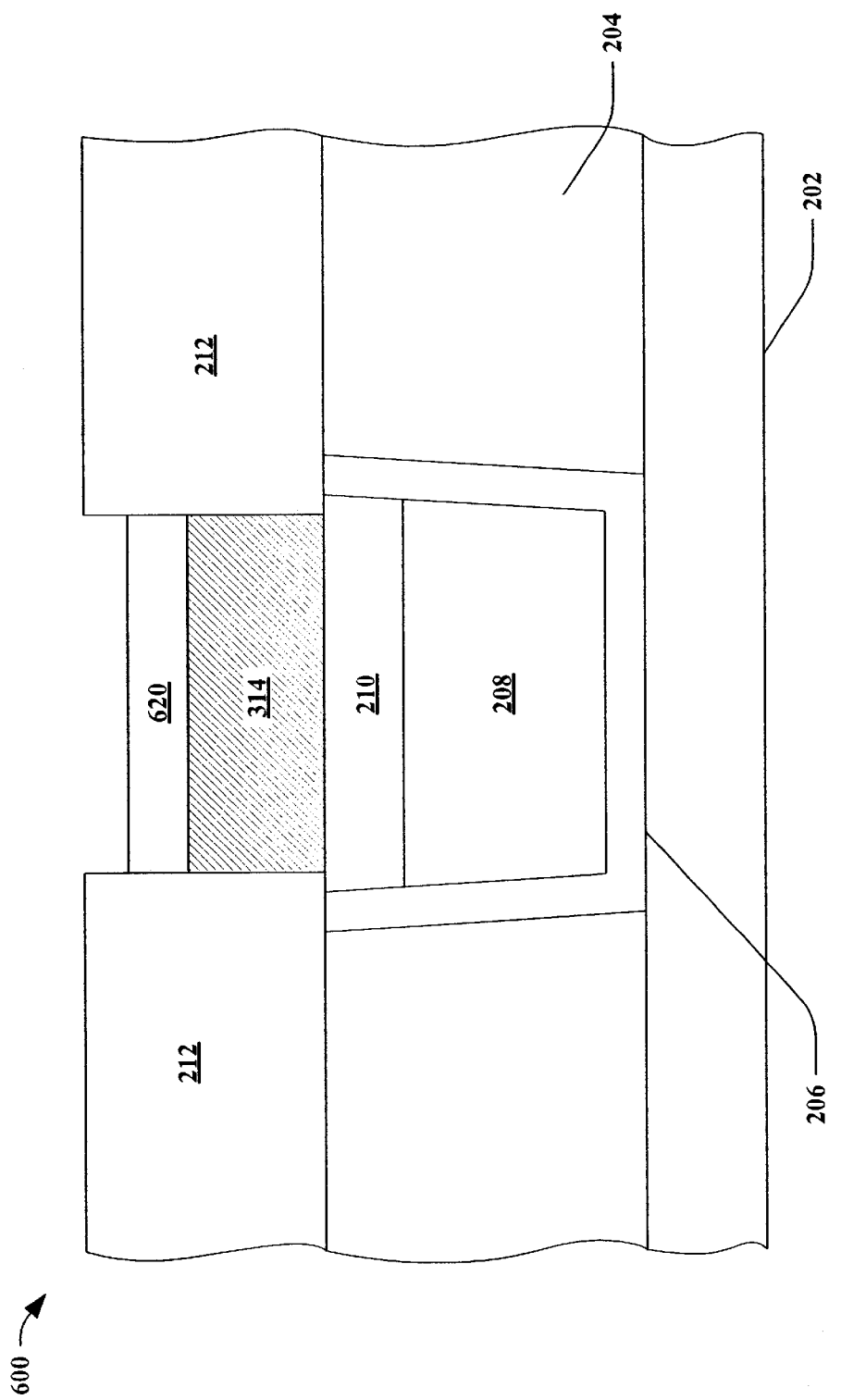
FIG. 6 is a cross sectional view of an organic memory device in accordance with an aspect of the present invention.

Continuing on with FIG. 6, another cross sectional view 600 of the memory device in accordance with an aspect of the present invention is depicted. This view 600 depicts the memory device with a top electrode 620 formed after completion of the electroless process. The top electrode 620 can be comprised of nickel, cobalt, chromium, silver, copper, other suitable materials, and/or alloys thereof. Additionally, alloys with copper and alloys with phosphor and boron can also be employed. The top electrode 620 is formed via the electroless process at locations where the activation compound 416 was previously deposited. As a result of the electroless formation, the top electrode 620 is able to be formed according to design specifications while mitigating damage to previously fabricated structures of the memory device. Additionally, the top electrode 620 has only been substantially formed on portions of the polymer activated with the activation compound 416.

Figure 7:
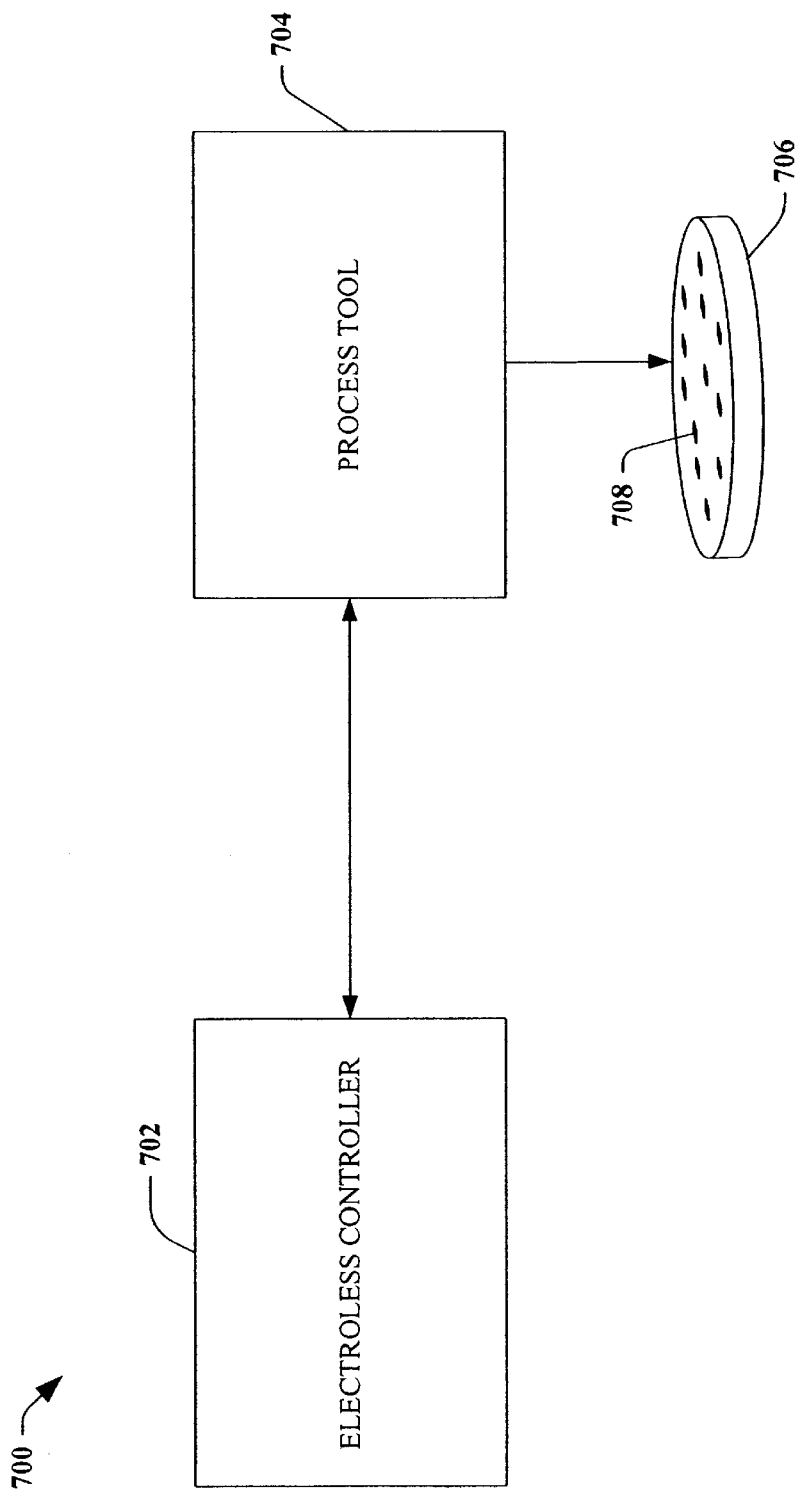
FIG. 7 is a block diagram illustrating a system for fabricating organic memory devices in accordance with an aspect of the present invention.

Turning now to FIG. 7, a block diagram of a system 700 for fabricating memory devices in accordance with an aspect of the present invention is depicted. The system includes an electroless controller 702, a process tool 704 and a wafer 706. The wafer 706 has memory device(s) 708 being fabricated on/in it. Specifically, the system 700 is operative to form an electrode as part the memory device 708 by utilizing an electroless process. The electroless process is a metal plating process that does not require or utilize a power source and/or electricity in order to plate metal.

The electroless controller 702 is operative to interface with the process tool 704 so as to controllably perform the electrode fabrication process. The controller 702 determines and controls a number of test parameters for the fabrication process such as activation compound, metal ions, thickness of electrode, duration of process, temperature and the like. These test parameters are selected and/or determined to meet design and/or process goals for the electrode fabrication process for this memory device. Simulations, modeling, neural networks, Bayesian networks, Bayesian belief networks and other mechanisms can be employed to determine the test parameters. It is appreciated that the electrode fabrication process is typically one of many fabrication processes required for the memory device 708. The electroless controller 702 can be implemented on a computer and/or as a computer component.

Although not so illustrated, the electroless controller 702 is able to receive and process feedback and feed forward information during the electrode fabrication process. While the test parameter techniques discussed supra are generally sufficient, real world results can vary. Thus, based on the feedback information, the electroless controller 702 is able to dynamically modify the test parameters to more closely obtain desired electrode dimensions whilst mitigating damage and/or decomposition to existing structures on the memory device.

As stated supra, the process tool 704 is controlled by the electroless controller 702 and performed the desired process on the memory device 708. The process tool 704 is the system component that physically and controllably performs fabrication process (e.g., by dispensing resist, patterning, rotating a wafer, etching and the like) according to test parameters. The process tool 704 controllably and selectively deposits the activation compound, which can also be referred to as a seed layer. Additionally, the process tool 704 initiates and controls flow of the chemical solution of a reducing agent and metal ions. In addition to controlling the fabrication process, the process tool 704 also includes components and/or devices that gather fabrication information during fabrication (e.g., in situ) and/or after fabrication (e.g., inspection). This fabrication information can include, for example, critical dimensions (e.g., in x and y directions, width and pitch (2D and 3D), temperature, pressure, overlay, defect and the like). Pitch measurements are measurements between substantially equivalent features. Width measurements are measurements of a single feature. Typically, devices such as scanning electron microscopes (SEM) and optical microscopy are utilized to obtain the measurements.

Referring once again to the electroless controller 704, the electrode fabrication process is initiated by first selectively depositing an activation compound or seed layer. This activation compound is deposited in those locations of the wafer 706 wherein a metal layer is desired. Generally, for memory devices, the activation compound is deposited at desired electrode locations (e.g., on a polymer to form the electrode/capacitor stack). A suitable activation compound, such as SnPd, is utilized which acts as a catalyst for the desired reaction. Then, the chemical solution comprising a reducing agent and metal ions is applied to the wafer 706 by a suitable mechanism. One such mechanism is to immerse the wafer 706 in a bath of the chemical solution. The metal ions can be nickel, cobalt, chromium, silver, copper, and the like in order to form an electrode comprised of nickel, cobalt, chromium, silver, copper, other suitable materials, and/or alloys thereof. Additionally, alloys with copper and alloys with phosphor and boron can also be formed and employed.

The electrode(s) are then formed by an electroless reaction which includes two partial reactions, oxidation and reduction. The reduction causes the metal ions to form on the surface of the wafer 706 at the locations where the activation compound has been deposited. This electroless reaction occurs at relatively low temperatures of about 35–75° C.

The system 700, in addition to electroless processing, can be employed for other suitable fabrication process such as, but not limited to, metallization, patterning, etching, doping, deposition, sputtering, polishing, and the like. Additionally, the system 700 and other aspects of the invention can be utilized to fabricate semiconductor devices that can be employed in a wide variety of computer and electronic devices such as computers, appliances, industrial equipment, hand-held devices, telecommunications equipment, medical equipment, research and development equipment, transportation vehicles, radar/satellite devices, and the like. Handheld devices, and particularly hand-held electronic devices, achieve improvements in portability due to weight reductions and/or increased computing capacity (e.g., increased processing power and memory storage). Examples of handheld devices include cell phones and other two way communication devices, personal data assistants, palm pilots, pagers, notebook computers, remote controls, recorders (video and audio), radios, small televisions and web viewers, cameras, and the like.

Figure 8:
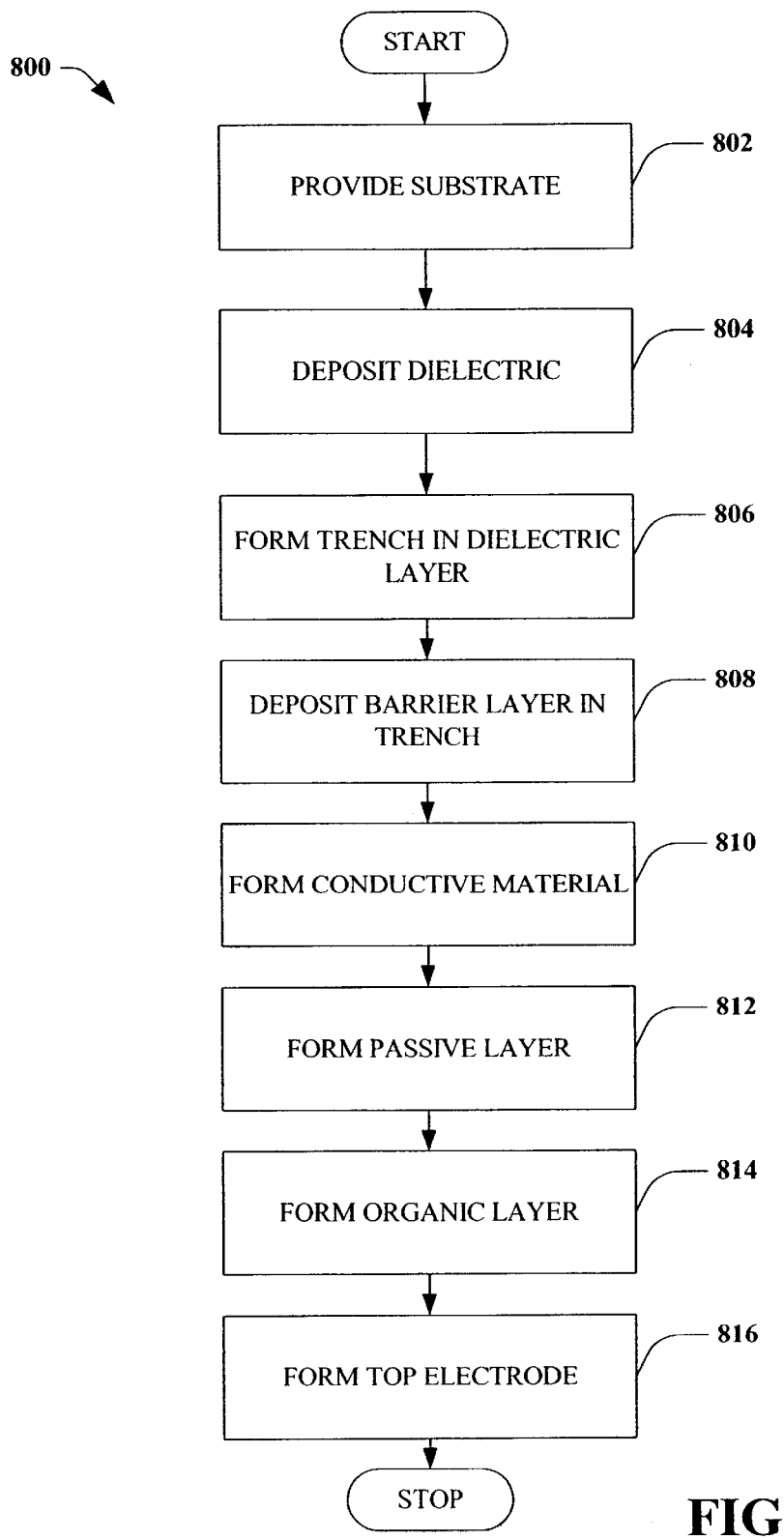
FIG. 8 is a flow diagram illustrating a method of fabricating an organic memory device in accordance with an aspect of the present invention.
Figure 9:
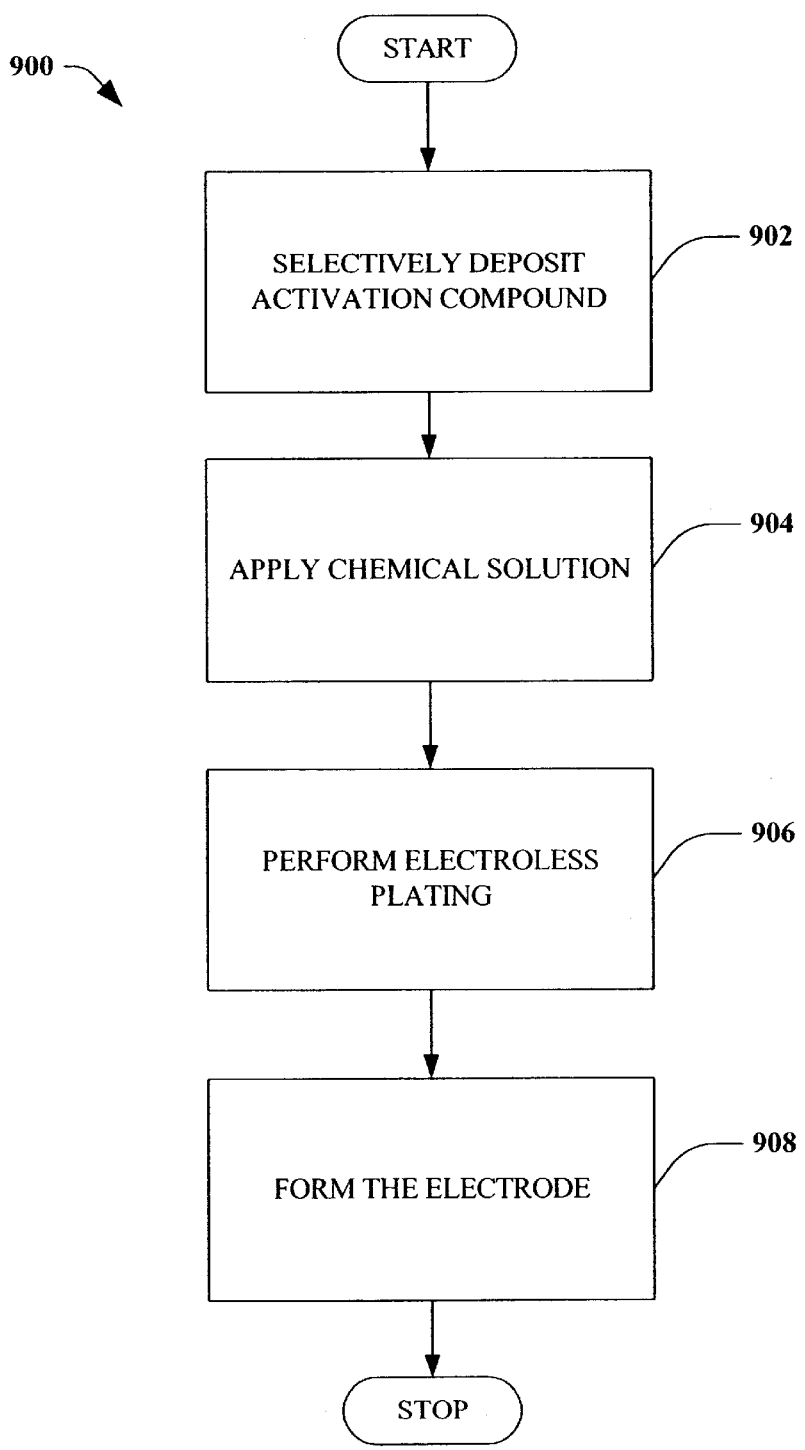
FIG. 9 is a flow diagram illustrating a method of forming an electrode in accordance with an aspect of the present invention.

In view of the foregoing structural and functional features described above, methodologies in accordance with various aspects of the present invention will be better appreciated with reference to FIGS. 8–9. While, for purposes of simplicity of explanation, the methodologies of FIGS. 8–9 is depicted and described as executing serially, it is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the present invention.

Turning now to FIG. 8, a flow diagram of a method 800 of fabricating an organic memory device in accordance with an aspect of the present invention is depicted. The method 800 is operative to form a top electrode at a relatively low temperature (e.g., 35–70° C.) without an external power source/supply. The organic memory device formed via the method 800 is substantially non-volatile and is not limited to only two states per memory cell of the memory device.

The method 800 begins at 802, wherein a semiconductor substrate is provided. The semiconductor substrate comprises one or more semiconductor layers. Then, at 804, a dielectric material is deposited in order to form a first dielectric layer. A variety of suitable deposition techniques can be utilized. Subsequently, the first dielectric layer is etched to form a trench in the first dielectric layer at 806. The trench is etched to a desired depth and width in order to accommodate later processing. The location of the trench is selected to include a desired cell stack location.

After forming the trench, a barrier layer is deposited in the trench at 808. A barrier material is deposited to form the barrier layer so as to mitigate migration from later formed components and structures. Then, a conductive material is selectively deposited in the trench over the barrier layer at 810 in order to form a lower electrode. A variety of suitable materials can be employed as discussed supra. Continuing at 812, a passive layer such as copper sulfide is formed on the lower electrode. The passive layer can be formed by deposition, sputtering, chemical mechanical polishing, and the like and combinations thereof of a conductivity facilitating compound such as copper sulfide. Other suitable materials for the passive layer are discussed supra. Additionally, it is appreciated that multiple individual passive layers can be formed as a single passive layer. Subsequent to forming the passive layer, an organic layer is formed on the passive layer at 814. Thus, an interface is formed between the passive layer and the organic layer. The organic layer generally comprises an organic polymer. Suitable materials which can be employed for the organic layer are described in detail supra, but are omitted here for brevity.

A top electrode is then formed over the organic layer at 816 by utilizing an electroless plating process. A variety of suitable conductive materials can be used such as nickel, cobalt, chromium, silver, copper, other suitable materials, and/or alloys thereof. Additionally, alloys with copper and alloys with phosphor and boron can also be employed. The top electrode is formed by first depositing an activation compound followed by a chemical solution comprising metal ions. An electroless reaction occurs because of the combination of the activation compound and the chemical solution, which results in causing the metal ions to plate or form over the organic layer.

For illustrative purposes, the method 800 has been substantially described with respect to a single organic memory cell. However, it is appreciated that the present invention is not limited to a single cell organic memory device and can, in fact, have any suitable number of memory cells and/or memory arrays.

Continuing with FIG. 9, a method 900 of forming an electrode in accordance with an aspect of the present invention is depicted. The method 900 forms an electrode comprised of a conductive material via an electroless plating process. Thus, the electrode can be formed without a high temperature and/or electrical current. The electrode can be utilized in semiconductors devices, such as, but not limited to, inorganic memory devices, organic memory devices and the like. The method 900 can also be utilized to form other types of conductive layers such as interconnects, plugs and the like. With respect to organic memory devices, the electrode formed by the method 900 can be utilized for conductive layers such as the top electrode and/or bottom electrode. In addition to the above, the electrode can be formed via the electroless reaction at relatively low temperatures of about 35–75° C.

The method 900 begins at 902 where an activation compound is deposited on selected locations of a semiconductor device. Generally, the activation compound is selectively deposited at specific locations in accordance with the device's design. The activation compound is selected so as to operate as a catalyst for the electroless process. The deposited activation compound can also be referred to as a seed layer. A variety of suitable activation compounds, such as SnPd, can be utilized for the seed layer. Then, at 904, a chemical solution is deposited over the semiconductor device. The chemical solution comprises a reducing agent and metal ions that are selected to meet device design specifications. The metal ions can be one or more of nickel, cobalt, chromium, silver, copper, and the like. The chemical solution is applied to the semiconductor device by a suitable mechanism such as, for example, immersing a wafer in a bath of the chemical solution. Continuing on at 906, an electroless plating process occurs that causes reduction of the metal ions of the chemical solution to a surface of the semiconductor device. Thus, the metal ions are plated to the seed layer. Finally, the metal ions are formed into the electrode at 908.

What has been described above are one or more aspects of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. In addition, while a particular feature of the invention may have been disclosed with respect to only one of several implementations, such feature may be combined with one or more other features of the other implementations as may be desired and advantageous for any given or particular application. Furthermore, to the extent that the term "includes" is used in either the detailed description and/or the claims, such term is intended to be inclusive in a manner similar to the term "comprising."

What is claimed is:

1. A method for forming an organic memory device comprising:

forming a first electrode;

forming a selectively conductive media formed on the first electrode that selectively facilitates migration of charge, the charge comprising at least one of electrons and holes; and forming a second electrode on the selectively conductive media via an electroless plating process.

2. The method of claim 1, the electroless plating process comprises an activation compound, a reducing agent and metal ions.

3. The method of claim 2, the activation compound is SnPd.

4. The method of claim 2, the activation compound comprises at least one of silver, copper, palladium or tin.

5. The method of claim 1, the second electrode comprising one or more selected from the group comprising nickel, cobalt, chromium, silver, copper, other suitable materials, and alloys thereof.

6. The method of claim 1, the second electrode comprising alloys with phosphor and boron.

7. The method of claim 1, the electroless process occurring at a temperature of about 35–85° C.

8. The method of claim 1, the first electrode comprising a material being selected from the group comprising aluminum, chromium, copper, germanium, gold, magnesium, manganese, indium, iron, nickel, palladium, platinum, silver, titanium, zinc, alloys thereof, indium-tin oxide, polysilicon, doped amorphous silicon, and metal silicides.

9. The method of claim 1, the selectively conductive media comprising at least one passive layer and an organic layer formed on the at least one passive layer.

10. A method of forming an organic memory device comprising:

selectively depositing an activation compound over a selectively conductive organic media;

applying a chemical solution to the activation compound and initiating an electroless reaction, the chemical solution comprising metal ions and a reducing agent; and reducing the metal ions of the chemical solution to plate over the selectively conductive organic media to form an electrode.

11. The method of claim 10, the activation compound being SnPd and the metal ions being selected from the group comprising nickel, cobalt, chromium, silver, and copper.

12. The method of claim 10, wherein applying the chemical solution comprises immersing a wafer comprising the organic memory device in a chemical bath.

13. The method of claim 10, wherein the reducing of the metal ions occurs at relatively low temperatures.

14. The method of claim 10, further comprising:

depositing a dielectric layer on a semiconductor substrate;

forming a trench in the dielectric layer;

depositing a barrier layer in the trench;

depositing a conductive material on the barrier layer to form a bottom electrode;

forming a passive layer on the barrier layer;

forming an organic layer on the passive layer; and wherein the selectively conductive media comprises the passive layer and the organic layer.

15. The method of claim 14, wherein the passive layer comprises copper sulfide and the bottom electrode comprises copper.

16. The method of claim 2, the metal ions comprising one or more selected from the group comprising copper, nickel, cobalt, chromium, and silver.

* * * * *

UNITED STATES PATENT AND TRADEMARK OFFICE
CERTIFICATE OF CORRECTION

PATENT NO. : 6,686,263 B1
DATED : February 3, 2004
INVENTOR(S) : Sergey D. Lopatin et al.

It is certified that error appears in the above-identified patent and that said Letters Patent is hereby corrected as shown below:

Column 4,
Line 34, "$I_{3O4}$" should be -- $I_3O_4$ --

Column 8,
Line 16, "$Fe_{3O4}$" should be -- $Fe_3O_4$ --

Signed and Sealed this

Twenty-second Day of June, 2004

JON W. DUDAS
*Acting Director of the United States Patent and Trademark Office*